US008762350B2

(12) United States Patent  
Relyea

(10) Patent No.: US 8,762,350 B2
(45) Date of Patent: *Jun. 24, 2014

(54) METHODS AND SYSTEMS FOR PROVIDING DATA OBJECTS ON A TOKEN

(75) Inventor: Robert Relyea, Mountain View, CA (US)

(73) Assignee: Red Hat, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/419,274

(22) Filed: Mar. 13, 2012

(65) Prior Publication Data

US 2012/0174202 A1 Jul. 5, 2012

Related U.S. Application Data

(63) Continuation of application No. 11/447,180, filed on Jun. 6, 2006, now Pat. No. 8,180,741.

(51) Int. Cl.
*G06F 7/00* (2006.01)
(52) U.S. Cl.
USPC ........................................................ 707/693
(58) Field of Classification Search
USPC .......... 707/693, 737, 609, 999.101; 726/9, 20
See application file for complete search history.

(56) References Cited

U.S. PATENT DOCUMENTS

| 4,108,367 | A | 8/1978 | Hannan |
| 4,849,614 | A | 7/1989 | Watanabe et al. |
| 4,924,330 | A | 5/1990 | Seamons et al. |
| 5,247,163 | A | 9/1993 | Ohno et al. |
| 5,355,414 | A | 10/1994 | Hale et al. |
| 5,499,371 | A | 3/1996 | Henninger et al. |
| 5,594,227 | A | 1/1997 | Deo |
| 5,631,961 | A | 5/1997 | Mills et al. |
| 5,666,415 | A | 9/1997 | Kaufman |
| 5,721,781 | A | 2/1998 | Deo et al. |
| 5,745,576 | A | 4/1998 | Abraham et al. |
| 5,745,678 | A | 4/1998 | Herzberg et al. |
| 5,768,373 | A | 6/1998 | Lohstroh et al. |
| 5,862,310 | A | 1/1999 | Crawford et al. |
| 5,923,884 | A | 7/1999 | Peyret et al. |

(Continued)

FOREIGN PATENT DOCUMENTS

| WO | WO9724831 | 7/1997 |
| WO | WO0048064 | 8/2000 |
| WO | WO2007096590 | 8/2007 |

OTHER PUBLICATIONS

"ATM and Credit Card Notification", Feb. 2005 (internet archive) pp. 1-2, www.thereareplaces.com/infgdes/money.atmnotif.htm.

(Continued)

*Primary Examiner* — Mohammed R Uddin
(74) *Attorney, Agent, or Firm* — Lowenstein Sandler LLP

(57) ABSTRACT

A computer system, method and/or computer-readable medium provide independent data objects to a token in compressed form. The independent data objects are representative of security information associated with the token. The system includes an interface operable to communicate with a token, and a processor cooperatively operable with the interface. The processor is configured to determine a set of independent data objects that are associated with the token, and to aggregate the set of independent data objects associated with the token into a group. Also, the processor is configured for compressing the group into a unit of contiguous data, and writing the unit of contiguous data to the token via the interface.

18 Claims, 6 Drawing Sheets

(56) References Cited

U.S. PATENT DOCUMENTS

| | | |
|---|---|---|
| 5,937,066 A | 8/1999 | Gennaro et al. |
| 5,943,423 A | 8/1999 | Muftic |
| 5,991,411 A | 11/1999 | Kaufman et al. |
| 5,991,882 A | 11/1999 | O'Connell |
| 6,005,942 A | 12/1999 | Chan et al. |
| 6,005,945 A | 12/1999 | Whitehouse |
| 6,011,847 A | 1/2000 | Follendore, III |
| 6,016,476 A | 1/2000 | Maes et al. |
| 6,044,155 A | 3/2000 | Thomlinson et al. |
| 6,072,876 A | 6/2000 | Obata et al. |
| 6,141,420 A | 10/2000 | Vanstone et al. |
| 6,141,743 A * | 10/2000 | Strongin ............ 712/33 |
| 6,178,507 B1 | 1/2001 | Vanstone |
| 6,179,205 B1 | 1/2001 | Sloan |
| 6,226,744 B1 | 5/2001 | Murphy et al. |
| 6,279,111 B1 * | 8/2001 | Jensenworth et al. ......... 726/10 |
| 6,377,825 B1 | 4/2002 | Kennedy et al. |
| 6,490,680 B1 | 12/2002 | Scheidt et al. |
| 6,502,108 B1 * | 12/2002 | Day et al. ............... 1/1 |
| 6,539,093 B1 | 3/2003 | Asad et al. |
| 6,636,975 B1 | 10/2003 | Khidekel et al. |
| 6,643,701 B1 | 11/2003 | Aziz et al. |
| 6,687,190 B2 | 2/2004 | Momich et al. |
| 6,691,137 B1 | 2/2004 | Kishi |
| 6,698,654 B1 | 3/2004 | Zuppicich |
| 6,734,886 B1 | 5/2004 | Hagan et al. |
| 6,760,752 B1 | 7/2004 | Liu et al. |
| 6,804,687 B2 | 10/2004 | Sampson |
| 6,819,766 B1 | 11/2004 | Weidong |
| 6,826,686 B1 | 11/2004 | Peyravian |
| 6,829,712 B1 | 12/2004 | Madoukh |
| 6,880,037 B2 * | 4/2005 | Boyer ............ 711/103 |
| 6,880,084 B1 | 4/2005 | Brittenham et al. |
| 6,898,605 B2 | 5/2005 | Constantino |
| 6,898,714 B1 | 5/2005 | Nadalin et al. |
| 6,931,133 B2 | 8/2005 | Andrews et al. |
| 6,941,326 B2 | 9/2005 | Kadyk et al. |
| 6,970,970 B2 | 11/2005 | Jung et al. |
| 6,978,933 B2 | 12/2005 | Yap et al. |
| 6,986,040 B1 | 1/2006 | Kramer et al. |
| 7,007,105 B1 | 2/2006 | Sullivan et al. |
| 7,010,600 B1 | 3/2006 | Prasad et al. |
| 7,050,589 B2 | 5/2006 | Kwan |
| 7,051,213 B1 | 5/2006 | Kobayashi et al. |
| 7,085,386 B2 | 8/2006 | Audebert et al. |
| 7,114,028 B1 | 9/2006 | Green et al. |
| 7,156,302 B2 | 1/2007 | Yap et al. |
| 7,159,763 B2 | 1/2007 | Yap et al. |
| 7,185,018 B2 | 2/2007 | Archbold et al. |
| 7,251,728 B2 | 7/2007 | Toh et al. |
| 7,278,581 B2 | 10/2007 | Ong |
| 7,299,364 B2 | 11/2007 | Noble et al. |
| 7,302,585 B1 * | 11/2007 | Proudler et al. ............ 713/189 |
| 7,356,688 B1 | 4/2008 | Wang |
| 7,374,099 B2 | 5/2008 | de Jong |
| 7,386,705 B2 | 6/2008 | Low et al. |
| 7,451,921 B2 | 11/2008 | Dowling et al. |
| 7,475,250 B2 | 1/2009 | Aull et al. |
| 7,475,256 B2 | 1/2009 | Cook |
| 7,480,384 B2 | 1/2009 | Peyravian et al. |
| 7,502,793 B2 | 3/2009 | Snible et al. |
| 7,571,321 B2 | 8/2009 | Appenzeller et al. |
| 7,602,910 B2 | 10/2009 | Johansson et al. |
| 7,702,917 B2 | 4/2010 | Tevosyan et al. |
| 7,769,996 B2 | 8/2010 | Randle et al. |
| 7,813,822 B1 * | 10/2010 | Hoffberg ............ 700/94 |
| 7,822,209 B2 | 10/2010 | Fu et al. |
| 7,860,243 B2 | 12/2010 | Zheng et al. |
| 2001/0008012 A1 | 7/2001 | Kausik |
| 2001/0036276 A1 | 11/2001 | Ober et al. |
| 2001/0054148 A1 | 12/2001 | Hoornaert et al. |
| 2002/0004816 A1 | 1/2002 | Vange et al. |
| 2002/0007351 A1 | 1/2002 | Hillegass et al. |
| 2002/0007359 A1 | 1/2002 | Nguyen |
| 2002/0010679 A1 | 1/2002 | Felsher |
| 2002/0029343 A1 | 3/2002 | Kurita |
| 2002/0056044 A1 | 5/2002 | Andersson |
| 2002/0059144 A1 | 5/2002 | Meffert et al. |
| 2002/0064095 A1 | 5/2002 | Momich et al. |
| 2002/0080958 A1 | 6/2002 | Ober et al. |
| 2002/0099727 A1 | 7/2002 | Kadyk et al. |
| 2002/0112156 A1 | 8/2002 | Gien et al. |
| 2002/0120842 A1 | 8/2002 | Bragstad et al. |
| 2002/0133707 A1 | 9/2002 | Newcombe |
| 2002/0171546 A1 | 11/2002 | Evans et al. |
| 2002/0184149 A1 | 12/2002 | Jones |
| 2002/0188848 A1 | 12/2002 | Buttiker |
| 2003/0005291 A1 | 1/2003 | Burn |
| 2003/0012386 A1 | 1/2003 | Kim et al. |
| 2003/0028664 A1 | 2/2003 | Tan et al. |
| 2003/0035548 A1 | 2/2003 | Kwan |
| 2003/0056099 A1 | 3/2003 | Asanoma et al. |
| 2003/0075610 A1 | 4/2003 | Ong |
| 2003/0093695 A1 | 5/2003 | Dutta |
| 2003/0115455 A1 | 6/2003 | Aull et al. |
| 2003/0115466 A1 | 6/2003 | Aull et al. |
| 2003/0115467 A1 | 6/2003 | Aull et al. |
| 2003/0115468 A1 | 6/2003 | Aull et al. |
| 2003/0167399 A1 | 9/2003 | Audebert et al. |
| 2003/0172034 A1 | 9/2003 | Schneck et al. |
| 2004/0042620 A1 | 3/2004 | Andrews et al. |
| 2004/0053642 A1 | 3/2004 | Sandberg et al. |
| 2004/0066274 A1 | 4/2004 | Bailey |
| 2004/0088562 A1 | 5/2004 | Vassilev et al. |
| 2004/0096055 A1 | 5/2004 | Williams et al. |
| 2004/0103324 A1 | 5/2004 | Band |
| 2004/0103325 A1 | 5/2004 | Priebatsch |
| 2004/0120525 A1 | 6/2004 | Miskimmin et al. |
| 2004/0144840 A1 | 7/2004 | Lee et al. |
| 2004/0146163 A1 | 7/2004 | Asokan et al. |
| 2004/0153451 A1 | 8/2004 | Phillips et al. |
| 2004/0162786 A1 | 8/2004 | Cross et al. |
| 2004/0230831 A1 | 11/2004 | Spelman et al. |
| 2005/0022123 A1 | 1/2005 | Costantino |
| 2005/0033703 A1 | 2/2005 | Holdsworth |
| 2005/0109841 A1 | 5/2005 | Ryan et al. |
| 2005/0114673 A1 | 5/2005 | Raikar et al. |
| 2005/0119978 A1 | 6/2005 | Ates |
| 2005/0123142 A1 | 6/2005 | Freeman et al. |
| 2005/0138386 A1 | 6/2005 | Le Saint |
| 2005/0138390 A1 | 6/2005 | Adams et al. |
| 2005/0144312 A1 | 6/2005 | Kadyk et al. |
| 2005/0184163 A1 | 8/2005 | de Jong |
| 2005/0184164 A1 | 8/2005 | de Jong |
| 2005/0184165 A1 | 8/2005 | de Jong |
| 2005/0188360 A1 | 8/2005 | de Jong |
| 2005/0216732 A1 | 9/2005 | Kipnis et al. |
| 2005/0262361 A1 | 11/2005 | Thibadeau |
| 2005/0279827 A1 | 12/2005 | Mascavage et al. |
| 2005/0289652 A1 | 12/2005 | Sharma et al. |
| 2006/0005028 A1 | 1/2006 | Labaton |
| 2006/0010325 A1 | 1/2006 | Liu et al. |
| 2006/0015933 A1 | 1/2006 | Ballinger et al. |
| 2006/0036868 A1 | 2/2006 | Cicchitto |
| 2006/0043164 A1 | 3/2006 | Dowling et al. |
| 2006/0072747 A1 | 4/2006 | Wood et al. |
| 2006/0073812 A1 | 4/2006 | Punaganti Venkata et al. |
| 2006/0075133 A1 | 4/2006 | Kakivaya et al. |
| 2006/0075486 A1 | 4/2006 | Lin et al. |
| 2006/0101111 A1 | 5/2006 | Bouse et al. |
| 2006/0101506 A1 | 5/2006 | Gallo et al. |
| 2006/0173848 A1 | 8/2006 | Peterson et al. |
| 2006/0174104 A1 | 8/2006 | Crichton et al. |
| 2006/0206932 A1 | 9/2006 | Chong |
| 2006/0208066 A1 | 9/2006 | Finn et al. |
| 2006/0226243 A1 | 10/2006 | Dariel |
| 2006/0291664 A1 | 12/2006 | Suarez et al. |
| 2006/0294583 A1 * | 12/2006 | Cowburn et al. ............... 726/10 |
| 2007/0014416 A1 | 1/2007 | Rivera et al. |
| 2007/0074034 A1 | 3/2007 | Adams et al. |
| 2007/0112721 A1 | 5/2007 | Archbold et al. |
| 2007/0113267 A1 | 5/2007 | Iwanski et al. |
| 2007/0113271 A1 | 5/2007 | Pleunis |
| 2007/0118891 A1 | 5/2007 | Buer |

(56) References Cited

U.S. PATENT DOCUMENTS

| | | |
|---|---|---|
| 2007/0162967 A1 | 7/2007 | de Jong et al. |
| 2007/0169084 A1 | 7/2007 | Frank et al. |
| 2007/0189534 A1 | 8/2007 | Wood et al. |
| 2007/0204333 A1 | 8/2007 | Lear et al. |
| 2007/0230706 A1 | 10/2007 | Youn |
| 2007/0271601 A1 | 11/2007 | Pomerantz |
| 2007/0277032 A1 | 11/2007 | Relyea |
| 2007/0280483 A1 | 12/2007 | Fu |
| 2007/0282881 A1 | 12/2007 | Relyea |
| 2007/0283163 A1 | 12/2007 | Relyea |
| 2007/0283427 A1 | 12/2007 | Gupta et al. |
| 2007/0288745 A1 | 12/2007 | Kwan |
| 2007/0288747 A1 | 12/2007 | Kwan |
| 2008/0005339 A1 | 1/2008 | Kwan |
| 2008/0019526 A1 | 1/2008 | Fu |
| 2008/0022086 A1 | 1/2008 | Ho |
| 2008/0022088 A1 | 1/2008 | Fu et al. |
| 2008/0022121 A1 | 1/2008 | Fu et al. |
| 2008/0022122 A1 | 1/2008 | Parkinson et al. |
| 2008/0022128 A1 | 1/2008 | Proudler et al. |
| 2008/0034216 A1 | 2/2008 | Law |
| 2008/0046982 A1 | 2/2008 | Parkinson |
| 2008/0056496 A1 | 3/2008 | Parkinson |
| 2008/0059790 A1 | 3/2008 | Parkinson |
| 2008/0059793 A1 | 3/2008 | Lord et al. |
| 2008/0069338 A1 | 3/2008 | Relyea |
| 2008/0069341 A1 | 3/2008 | Relyea |
| 2008/0072283 A1 | 3/2008 | Relyea |
| 2008/0077794 A1 | 3/2008 | Arnold et al. |
| 2008/0077803 A1 | 3/2008 | Leach et al. |
| 2008/0133514 A1 | 6/2008 | Relyea |
| 2008/0148047 A1 | 6/2008 | Appenzeller et al. |
| 2008/0189543 A1 | 8/2008 | Parkinson |
| 2008/0209224 A1 | 8/2008 | Lord |
| 2008/0209225 A1 | 8/2008 | Lord |
| 2008/0229401 A1 | 9/2008 | Magne |
| 2009/0003608 A1 | 1/2009 | Lee et al. |
| 2009/0133107 A1 | 5/2009 | Thoursie |
| 2010/0313027 A1 | 12/2010 | Taylor |
| 2012/0303622 A1* | 11/2012 | Dean et al. .................... 707/737 |

OTHER PUBLICATIONS

"AMD Announces Specification for Open Platform Management Architecture", Feb. 28, 2005, pp. 1-2, http://www.thefreelibrary.com/AMD+Announces+Specification+for+Opten+Platform+Management+Architecture-a0129342307.

Balfanz, Dirk A., "Access Control for Ad-Hoc Collaboration", Princeton University Jan. 2001.

Bellovin and Merritt, "Augmented Encrypted Key Exchange: a Password-Based Protocol Secure Against Dictionary Attacks and Password File Compromise", Proceedings fo the 1st ACM Conference on Computer and Communications Security, Nov. 1993.

Cryptographic Message Syntax, R.Housley, Request for Comments (RFC) 2630, Network Working Group, The Interent Society, Jun. 1999.

PKCS#11 v2.20: Cryptographic Token Interface Standard, RSA Laboratories, Jun. 28, 2004, (see, e.g. Chapter 10, Objects) (see www.rsasecurity.com, 407 pgs).

Red Hat Certificate System, http://www.redhat.com/f/pdf/rhas/DirSecProductSheetCertificateSystem.pdf, Jun. 2005.

Schneier, "Applied Cryptography: Protocols, Algorithms, and Source Code in C", 1996, John Wiley & Sons, Inc. Second Edition, pp. 455-456.

Schneier, Bruce. Applied Cryptography, Second Edition. 1996 John Wiley and Sons, pp. 480-481.

Zuccherato, Robert, "Elliptic Curve Cryptography Support in Entrust", May 9, 2000.

USPTO; Office Action for U.S. Appl. No. 11/447,180, mailed Jun. 3, 2008.

USPTO; Office Action for U.S. Appl. No. 11/447,180, mailed Mar. 16, 2010.

USPTO; Office Action for U.S. Appl. No. 11/447,180, mailed Mar. 2, 2011.

USPTO; Office Action for U.S. Appl. No. 11/447,180, mailed Jul. 28, 2011.

USPTO; Notice of Allowance for U.S. Appl. No. 11/447,180, mailed Nov. 25, 2011.

* cited by examiner

METHODS AND SYSTEMS FOR PROVIDING DATA OBJECTS ON A TOKEN

CROSS-REFERENCES TO RELATED APPLICATIONS

This present patent application is a continuation of U.S. patent application Ser. No. 11/447,180, filed Jun. 6, 2006, the contents of which are incorporated by reference herein.

FIELD

The present invention relates in general to data stored on a token, and more specifically to data stored in a memory of a token utilizing data compression.

BACKGROUND

Security information such as digital certificates, keys, identifiers, and related data can be stored in a token, for example a smartcard, security token, USB (universal serial bus) token or the like. The security information stored in the token can be utilized in connection with communications to provide a greater degree of security.

Initialization involving a token typically includes accessing at least some of the security information stored on the token. Reading from or writing to a token, however, can be unacceptably slow. Despite the relatively long access times, it can be prudent to rely on the token to provide security.

In addition, a token tends to have a limited memory capacity. A maximum memory capacity of, for example, 32K is not uncommon. Higher capacity tokens tend to be more expensive and therefore less desirable. Consequently, the amount of memory occupied by stored instructions and data can be a constraint in designing an application using a token.

BRIEF DESCRIPTION OF THE DRAWINGS

The accompanying drawings, which are incorporated in and constitute a part of this specification, illustrate various exemplary embodiments of the invention and together with the description, serve to explain the principles of the invention. In the figures.

DETAILED DESCRIPTION

Figure 1:
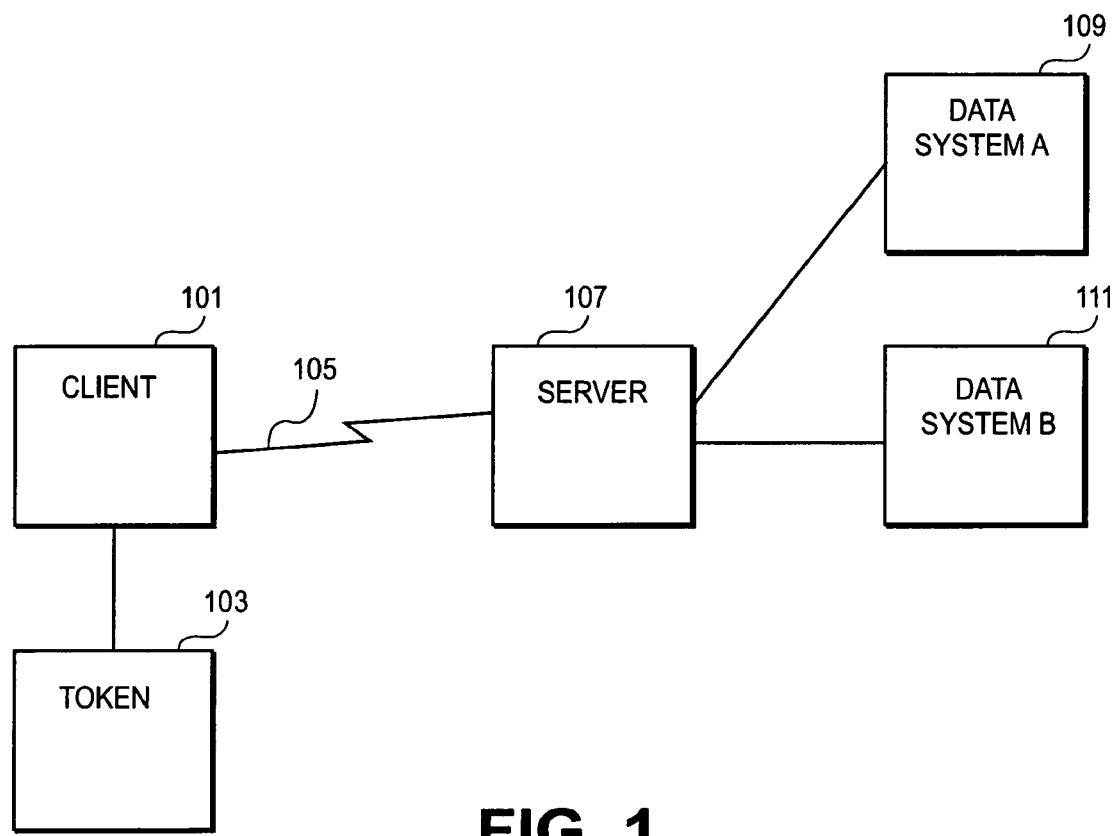
FIG. 1 illustrates a simplified and representative environment associated with a computer system.

In overview, the present disclosure concerns secure systems such as may be operated in connection with certifying and/or authenticating identifiers associated with users and/or computers and/or tokens. Such secure systems may be utilized in connection with other services such as communications, secured access, and/or telecommunications. Such secure systems can include computer systems which support the use of tokens to access independent data objects representing certificates, keys, identifiers, and related data, for example by providing end-user interfaces, managing keys, and providing authentication. More particularly, various inventive concepts and principles are embodied in systems, devices, and methods therein for reading and/or writing independent data objects to/from a token.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore, and/or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the exemplary embodiments.

As further discussed herein below, various inventive principles and combinations thereof are advantageously employed to make an efficient use of storage space on a token. Furthermore, the amount of time expended in initializing with the token can be reduced.

Further in accordance with exemplary embodiments, a computer system, such as a server acting as a registration authority, can compress and place independent data objects onto a token. Also, a computer system, such as a client interfacing with a user, can retrieve such compressed data objects from the token. Rather than compressing data objects individually, the data objects are aggregated into one space, and the space as a whole is compressed.

The phrase "data objects" as used herein refers to information representing certificates, public keys, standard cryptographic token interface data (such as according to PKCS (public key cryptography standard) #11), identifiers, and related data. This information is conventionally stored somewhere on the token.

Reference will now be made in detail to the accompanying drawings. Wherever possible, the same reference numbers will be used throughout the drawings to refer to the same or like parts.

Referring now to FIG. 1, a simplified and representative environment associated with a computer system will be discussed and described. The environment includes a client 101, a token 103, and a server 107. The server 107 and client 101 are connected via a connection 105. The server 107 can have access to information stored locally at the server 107, and to information stored remotely, here represented by data system A 109 and data system B 111.

The server 107 may be a computing machine or platform configured to execute secure and/or unsecure (or open) applications through a multiple-user operating system (not shown) in conjunction with the client 101. The server 107 may be implemented using one or a combination of server platforms as known to those skilled in the art from Intel, Advanced Micro Devices, Hewlett-Packard, and/or others.

The server 107 may interact with the client 101 over the connection 105, for example a communication network. The connection 105 provides a communication channel for the server 107 and the client 101 to exchange data and commands, as well as for the server 107 to interface to the token 103.

The client 101 can be a computing machine or platform (machine) configured to execute secure and/or open applications through the multi-user operating system. The client 101 may be implemented on a personal computer, a workstation, a thin client, a thick client, or other similar computing platform. The client 101 may be configured to interface with the token 103. The client 101, the token 103 and the server 107 can be configured in accordance with known techniques so that the server 103 can connect to the token 103 transparently through the client 101. In accordance with known techniques, the connection 105 can be a secure connection.

Figure 2:
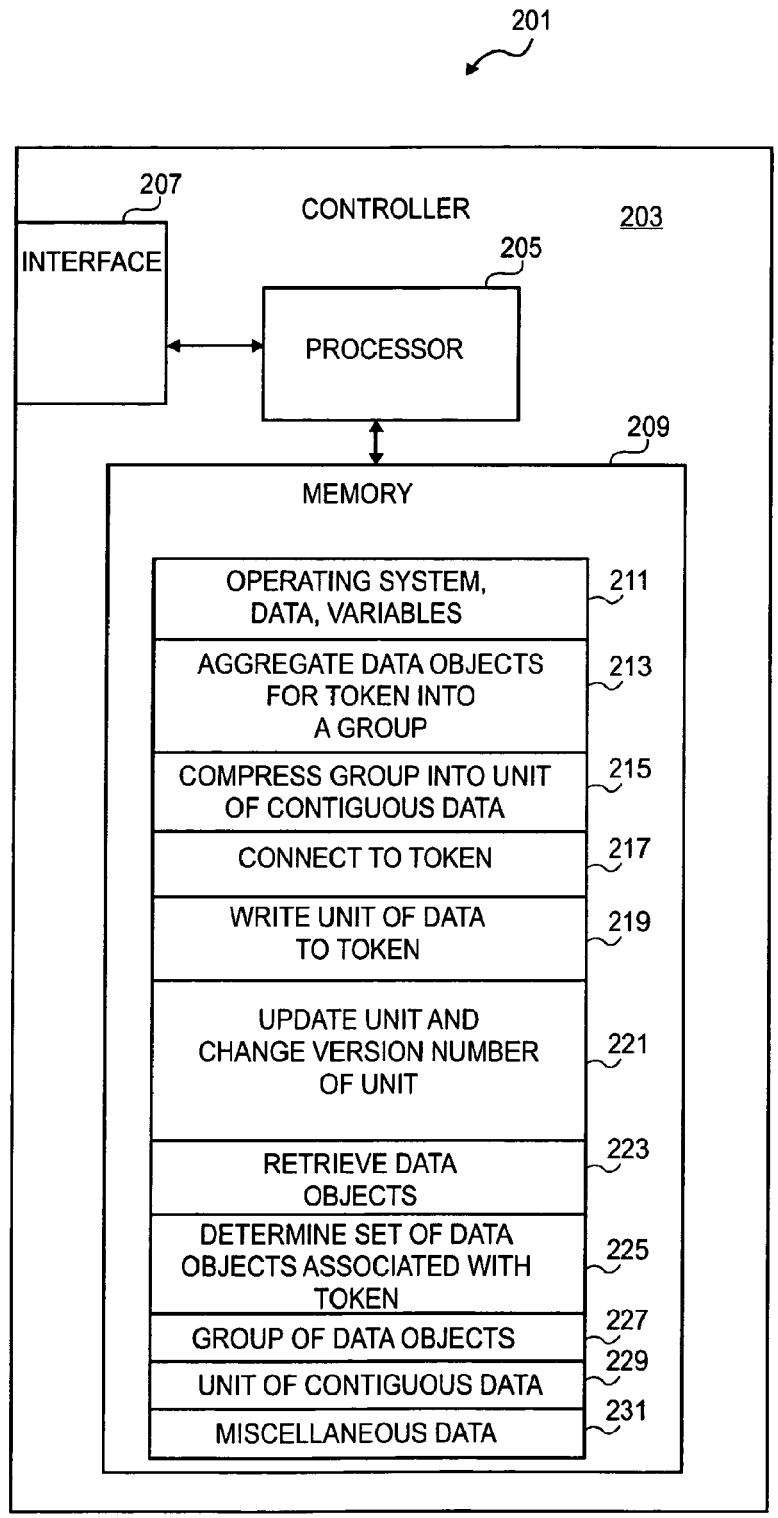
FIG. 2 is a block diagram illustrating portions of a computer.
Figure 3:
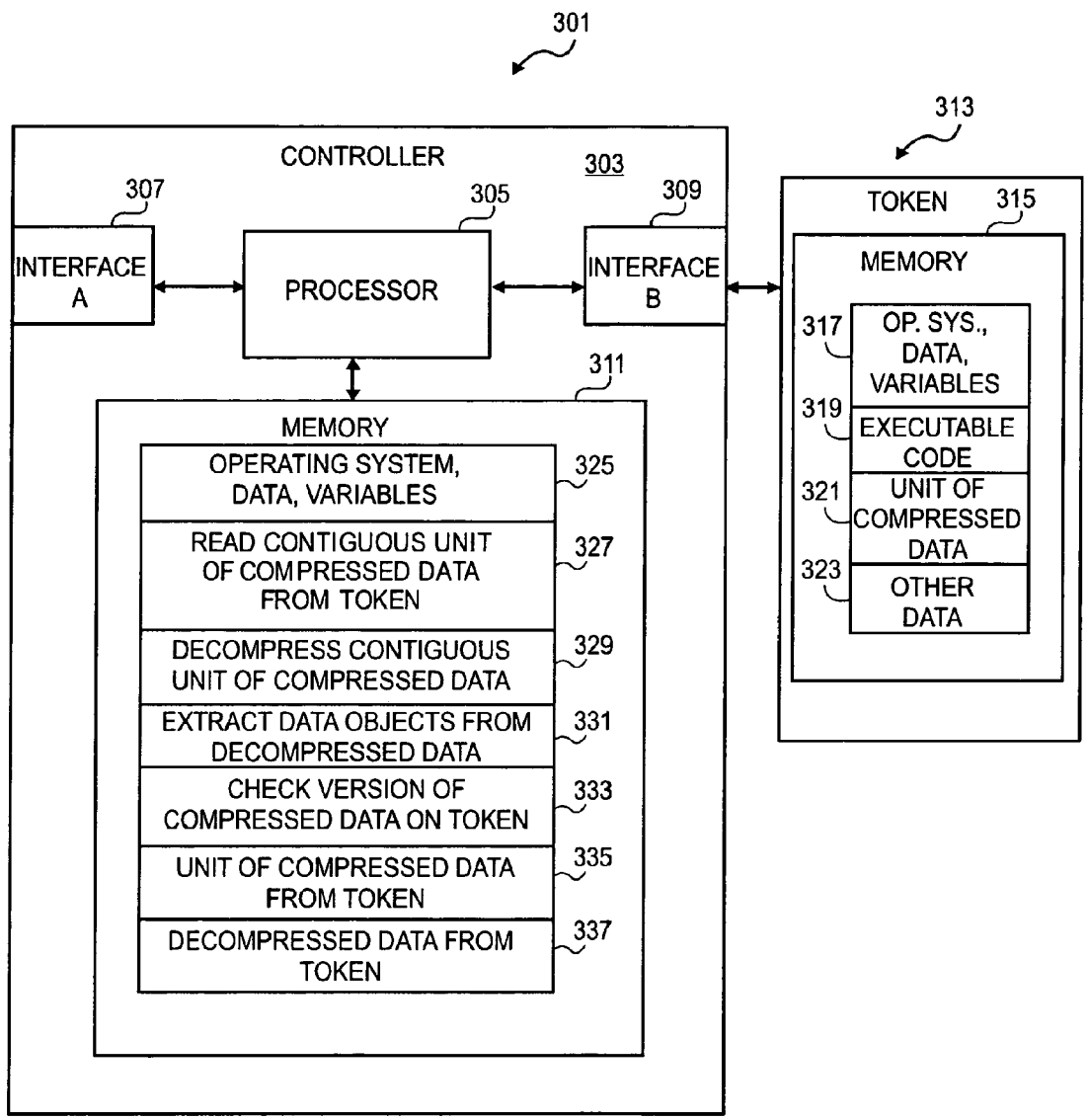
FIG. 3 is a block diagram illustrating portions of a computer and a token.

FIG. 2 illustrates an example computer that can be utilized as the server 107. FIG. 3 utilizes an example computer and token that can be conveniently used as the client 101 and token 103.

Referring now to FIG. 2, a block diagram illustrating portions of a computer 201 will be discussed and described. The computer 201 may include an interface 207 and one or more controllers 203. The controller 203 can include a processor 205 and a memory 209. Also, the computer 201 can include optional peripherals such as a display (not illustrated) and/or various known input devices (not illustrated), such as a keypad, a computer mouse, a touchpad, a touch screen, a trackball, and/or a keyboard.

The processor 205 may comprise one or more microprocessors and/or one or more digital signal processors. The memory 209 may be coupled to the processor 205 and may comprise a read-only memory (ROM), a random-access memory (RAM), a programmable ROM (PROM), a flash memory, and/or an electrically erasable read-only memory (EEPROM). The memory 209 may include multiple memory locations for storing, among other things, an operating system, data and variables 211 for programs executed by the processor 205; computer programs for causing the processor to operate in connection with various functions such as aggregating data objects corresponding to the token into a group 213, compressing the group into a unit of contiguous data 215, connecting to the token 217, writing a unit of data to the token 219, updating the unit and changing the version number of the unit 221, retrieving data objects 223, determining a set of data objects associated with the token 225, and/or other processing; a location for a group of data objects 227; a location for a unit of contiguous data 229; and a location for miscellaneous other data 231 by the processor 205. The computer programs may be stored, for example, in ROM or PROM and may direct the processor 205 in controlling the operation of the computer 201.

The processor 205 may be programmed for aggregating a set of data objects corresponding to the token into a group 213. To achieve an efficient data compression, the group of data objects is structured so that the data objects are located in contiguous memory. More particularly, the data objects within the group can be contiguously located in the memory, although it is also envisioned that the data objects in the group can be formatted so there is empty information between data objects which does not increase the size of the compressed data. Therefore, compression can be performed on the group of data objects as a unit, rather than on individual data objects. The location of particular data objects within the group of data objects can be specified by a predetermined format, which also can be utilized to extract the data objects when the data is de-compressed. Accordingly, one or more embodiments provide that the independent data objects in the set are aggregated in the group according to a predetermined format.

The processor 205 can be programmed for compressing the group to form a unit of contiguous data 215. Any known compression technique can be utilized to compress the group, provided that the group of data is compressed rather than compressing individual data objects separately.

Also, the processor 205 can be programmed for connecting 217 to the token (not illustrated) via the interface 207. Known techniques can be utilized to establish and maintain a connection. Such a connection optionally can be a secure connection, for example utilizing cryptographic techniques. The token can be connected locally or remotely to the interface 207. If the token is located remotely, the connection can be end-to-end between the interface 207 and the token through an intermediate computer (not illustrated), such as discussed in connection with FIG. 3. Accordingly, the writing of the data to the token can be performed remotely via a secure connection over the interface.

Optionally, the processor 205 can be programmed for writing a unit of data to the token (not illustrated) 219. Techniques are known for writing data to tokens, when the computer 201 is connected to the token. For example, when the computer 201 and token are remotely connected via an intermediate computer (not illustrated), the token can be written in a manner transparent to the intermediate computer such as via a tunnel connection.

Optionally, the processor 205 can be programmed for updating the unit of contiguous data and/or changing the version number of the unit 221. One or more independent data objects can be modified, for example, when a user alters a certificate. Therefore, it can be desirable to update the unit of contiguous data. Various techniques can be utilized to determine that the unit is ready for updating, for example, checking whether any independent data object has been changed, flagging the unit when an independent data object was changed, expiration of a time limit, or the like. The unit of contiguous data can be updated, for example by retrieving, into the unit, the independent data objects related to the token corresponding to the unit; or by retrieving, into the unit, independent data objects known to have been modified. A version number can be associated with the unit of contiguous data and/or the group of data. The version number can be changed, for example, incremented or toggled, so that revised versions for the same token can be distinguished. The version number can be stored in the group of data, stored in the contiguous data (and compressed), stored in the compressed contiguous data, and/or stored separately. Accordingly, one or more embodiments provide for associating a version number with the unit written to the token, and writing the version number to the token in association with the unit, wherein the version number is changed when the unit for the token is changed.

Additionally, the processor 205 can be programmed for retrieving independent data objects 223. The independent data objects can be in various locations, for example located locally at the computer 201 and/or remotely (for example in data systems illustrated in FIG. 1). The processor can have information indicating the locations of the independent data objects, for example, a table of pointers and/or unique identifiers. The independent data objects can be retrieved from the locations. The term "independent" is used herein to indicate that a particular data object is not adjacent in memory to at least one other data object to be included in the set of independent data objects that is to be compressed. In some instances, independent data objects may be provided in different data structures, different databases, and/or in different memory devices. Accordingly, one or more embodiments provide for retrieving at least a portion of the set of independent data objects from non-contiguous locations in memory before the aggregating.

Further, the processor 205 can be programmed for determining a set of data objects associated with the token 225. The data objects that are associated with the token can include data objects specific to the token (such as PKCS #11 data and certificates), and/or data objects which are common to other tokens (such as public keys). The processor 205 can include one or more maps, tables, arrays and/or other storage structure(s) indicating data objects that are associated with tokens.

A portion of the memory 209 can be allocated for the group of data objects 227, and for the unit of contiguous data 229. Optionally, the group of data objects 227 and/or unit of contiguous data 229 can be for stored for each of multiple tokens.

Therefore, according to one or more embodiments, a computer system provides independent data objects to a token in compressed form, wherein the independent data objects are representative of security information associated with the token. The computer system includes an interface operable to communicate with a token; and a processor cooperatively operable with the interface. The processor is configured to determine a set of independent data objects that are associated with the token, aggregating the set of independent data objects associated with the token into a group, compressing the group into a unit of contiguous data, and writing the unit of contiguous data to the token via the interface.

It should be understood that various logical groupings of functional blocks are described herein. Different realizations may omit one or more of these logical groupings. Likewise, in various realizations, functional blocks may be grouped differently, combined, or augmented. Furthermore, one or more functional blocks including those identified herein as optional can be omitted from various realizations. For example, the present description may describe or suggest a database or collection of data and information. One or more embodiments can provide that the database or collection of data and information can be distributed, combined, or augmented, or provided locally and/or remotely (illustrated in FIG. 1).

Referring now to FIG. 3, a block diagram illustrating portions of a computer 301 and a token 313 will be discussed and described. A description of the computer 301 is provided first, followed by a description of the token 313.

The computer 301 may include one or more controllers 303, and one or more interfaces, here represented by an interface A 307 and an interface B 309. The interface A 307 can be utilized in connection with a communication network, for example to connect to another computer. The interface B 309 can be utilized to connect to the token 313, for example utilizing known USB (universal serial bus) technology, a smart card reader, or the like. The computer 301 can include optional known peripherals for interfacing with a user, such as a display and input devices (not illustrated). The controller 303 can include a processor 305 and a memory 311. The processor 305 in the computer 301 may comprise one or more microprocessors and/or one or more digital signal processors; the memory 311 can be coupled to the processor 305 and may comprise a ROM, a RAM, a PROM, flash memory, and/or an EEPROM. The memory 311 may include multiple memory locations and stores an operating system, data and variables 325; computer programs including those discussed below which can direct the processor 305 in controlling the operation of the computer 301; a location for a unit of compressed data from the token 335; and a location for decompressed data from the token 337. The computer programs can include, for example, reading a unit of compressed data from the token 327, decompressing the unit of compressed data from the token 329, extracting data objects from the decompressed data 331, optionally checking the version of the compressed data on the token 333, and/or other processing. These are described in more detail below.

The computer 301 can be programmed to read a contiguous unit of compressed data from the token 327. For example, when the token 313 is connected to the computer 301 via the interface B 309, known techniques can be utilized to connect to and read data from the token. One or more particular blocks in the token 313 which are pre-defined for storing the compressed data can be read. In this example, the compressed data is read from the token into a location in the memory 311 of the computer 301 specified for storing the compressed data 335.

The computer 301 can be programmed for decompressing the unit of compressed data from the token 329. Standard techniques can be utilized to decompress the data. The compressed data stored in the memory 311 can be decompressed as a unit.

The computer 301 can be programmed for extracting data objects from the decompressed data 331. The predetermined format of the data objects which were initially grouped together is known. Therefore, the locations of the data objects in the decompressed data is known. An application can extract the data objects from the decompressed data according to the predetermined format. The decompressed data optionally can be parsed to extract the data objects. Accordingly, one or more embodiments can provide that the independent data objects in the decompressed data are parsed according to a predetermined format.

Optionally, the computer 301 can be programmed for checking the version of the compressed data on the token 333. The version can be checked, for example by comparing a prior version number with the version number associated with the compressed data on the token, by comparing a prior block of compressed data with the current compressed data, or similar. Thus, according to alternate embodiments, the checking includes comparing at least one block of the compressed data to a previously stored block from the same token; and/or the checking can include comparing a version associated with the compressed data to a previous version. If the version is unchanged from the prior version, it may not be necessary to read the compressed data from the token, to decompress the data, and/or to extract the data objects from the decompressed data. Accordingly, one or more embodiments can include checking whether the compressed data on the token is changed, and performing the reading, decompressing and extracting only if the compressed data on the token is changed.

The token 313 will now be described. The token 313 can include various elements which will be well understood to those of skill in this art, and accordingly such elements are omitted from this description. A memory 315 of any of the various types described herein is provided in the token. The memory 315 can include a basic operating system, data, and variables 317; executable code 319; a unit of compressed data 321; and other data 323.

The unit of compressed data 321 can be stored in block boundaries. A block of memory in the typical token 313 is, for example, typically 100 bytes or 255 bytes. Consider a simplified example where the block of memory is 100 bytes, and the data to be loaded onto the token 313 includes two certificates, where each certificate can be individually compressed to 102 bytes. When each individually compressed certificate is individually written to the token 313, each uses two 100 byte blocks, for a total of four blocks of memory in the token 313. On the other hand, when the two certificates are grouped and compressed to form a unit of contiguous data, the unit of contiguous data is 204 bytes or less (depending on the compression technique). The unit of contiguous data then uses a total of three blocks of memory in the token 313. Accordingly, one or more embodiments can provide that the writing of data to the token is performed by writing the data in blocks.

Figure 4:
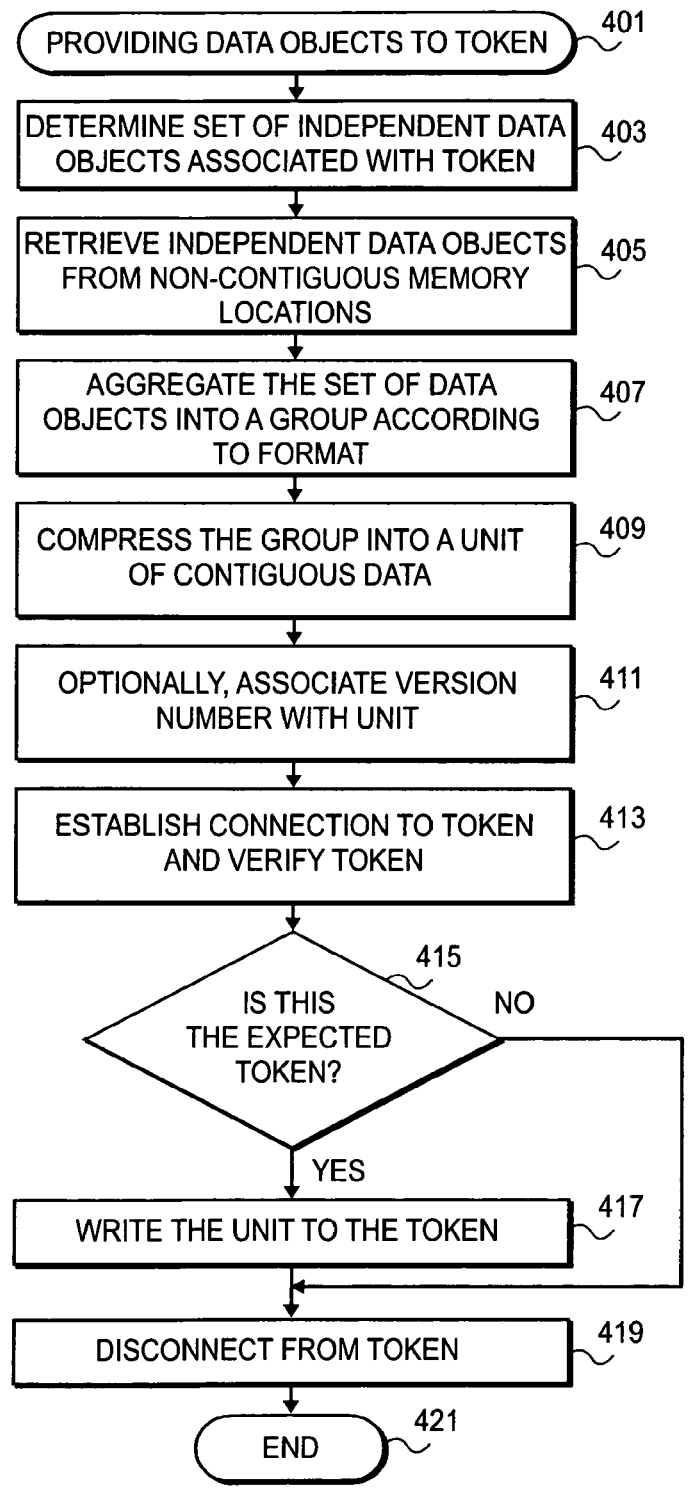
FIG. 4 is a flow chart illustrating a procedure for providing data objects to a token.
Figure 5:
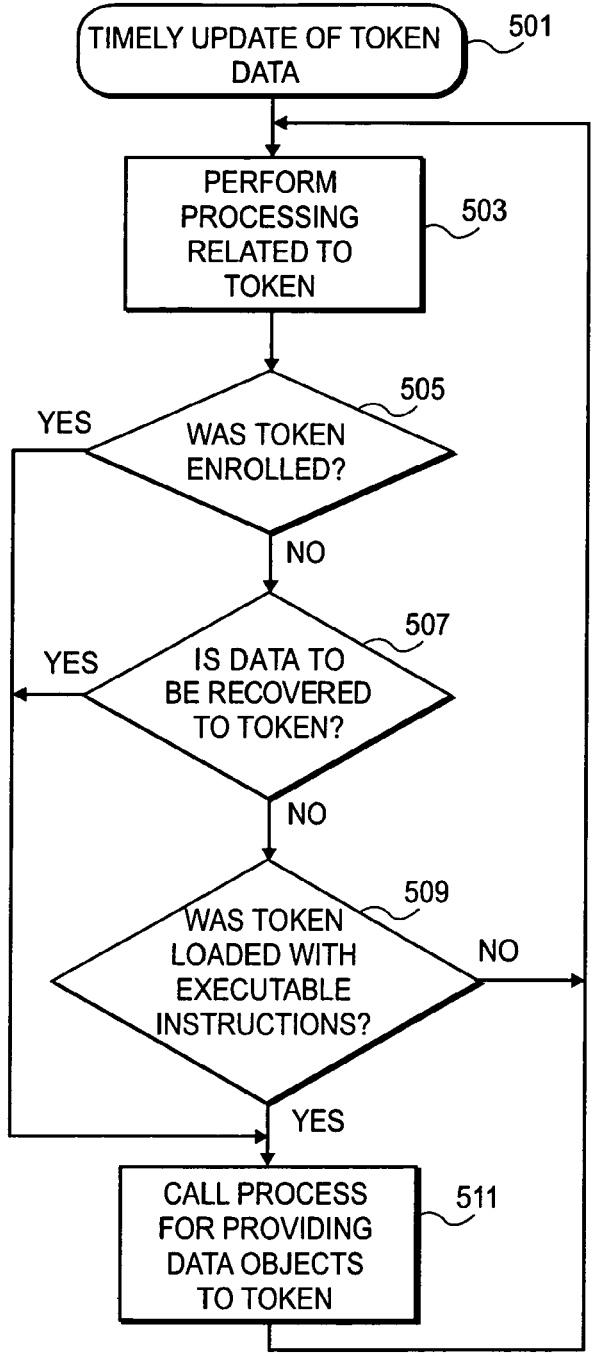
FIG. 5 is a flow chart illustrating a procedure for a timely update of token data.

FIG. 4 and FIG. 5 together illustrate procedures for providing data objects to a token, where FIG. 4 is an example procedure for writing the data objects to the token, and FIG. 5 is an example of an upper level process that calls the procedure for writing the data objects at certain events. The procedures of FIG. 4 and FIG. 5 can advantageously be implemented on, for example, a processor of a computer described in connection with FIG. 2 or other apparatus appropriately arranged.

Referring now to FIG. 4, a flow chart illustrating a procedure 401 for providing data objects to a token will be discussed and described. Details which have been previously described will be omitted from the following detailed description of the procedure 401.

The procedure 401 can include determining 403 the independent data objects associated with the token. Once determined, the independent data objects can be retrieved 405 from memory locations, to form a set of data objects. The set of data objects can be aggregated 407 into a group. The group of data objects can be compressed 409 to form a unit of contiguous data. The procedure 401 can optionally include associating 411 a version number with the unit of contiguous data.

The procedure 401 can include establishing 413 a connection to the token. Optionally, the procedure can include verifying 415 that the token is as expected, for example by reading a unique identifier stored on the token and comparing the stored identifier to an identifier expected to be stored the token. Accordingly, one or more embodiments provide for connecting to the token and verifying that the token is the token corresponding to the unit of data.

If the token is the expected token, the unit of contiguous data can be written 417 to the token. The procedure can include optionally disconnecting 419 from the token.

The process of providing the data objects to the token can then be ended 421. Other embodiments can provide that the unit of contiguous data is created in a process separate from and/or independent of a process of writing the unit of contiguous data to the token.

One or more embodiments can include a method of providing independent data objects to a token, wherein the independent data objects are representative of security information associated with the token. The method includes determining a set of independent data objects that are associated with a token, aggregating the set of independent data objects into a group, compressing the group into a unit of contiguous data, and writing the unit of contiguous data to the token.

Referring now to FIG. 5, a flow chart illustrating a procedure 501 for a timely update of token data will be discussed and described. Conventional processing 503 related to the token can be performed. Various types of conventional processing can cause a change to the independent data objects associated with the token, and/or can cause an unpredictable change to the compressed data stored on the token. In the illustrated procedure 501, the data objects are provided to the token if 505 the token was enrolled, if 507 data for the token is to be recovered, or if 509 the token was loaded with executable instructions. The independent data objects associated with the token can change when the token is enrolled and/or when data is to be recovered to the token. On the other hand, when executable instructions (for example, operating system or applications) are loaded to the token, the executable instructions can overwrite the compressed data stored on the token. Hence, when one of these events occurs, the procedure 501 can call 511 the previously-described process for providing the data objects to the token.

Accordingly, the writing of the unit to the token can be performed when the token is enrolled, when data corresponding to the token is recovered to the token, and/or when the token is loaded with executable instructions.

Figure 6:
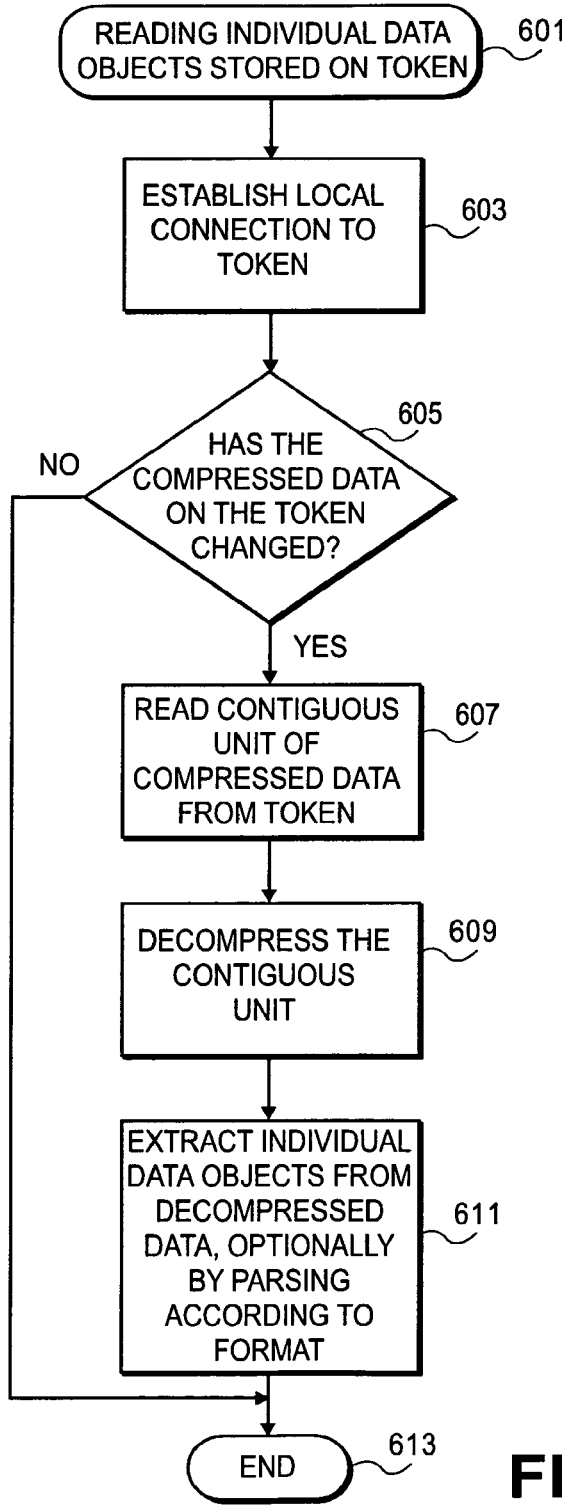
FIG. 6 is a flow chart illustrating a procedure for reading individual data objects stored on a token.

Referring now to FIG. 6, a flow chart illustrating a procedure 601 for reading individual data objects stored on a token will be discussed and described. The procedure 601 can advantageously be implemented on, for example, a processor of a computer illustrated in connection with FIG. 3 or other apparatus appropriately arranged. Many details related to the procedure in FIG. 6 have been discussed above, and will not be repeated below.

The procedure 601 can include establishing 603 a local connection to the token. Optionally, the procedure 601 can determine 605 whether the compressed data on the token has changed. If the compressed data on the token has changed, the procedure can read 607 a contiguous unit of compressed data from the token, decompress 609 the contiguous unit, and extract 611 individual data objects from the decompressed data, optionally by parsing the decompressed data according to a predetermined format. The procedure 610 can then end 613.

Accordingly, there can be provided a method for reading individual data objects that are representative of security information associated with the token and stored on a token together in compressed form. The method can include reading a contiguous unit of compressed data from the token; decompressing the contiguous unit of compressed data to form decompressed data; and extracting independent data objects from the decompressed data.

Any of the above can be embodied on a computer readable medium, which includes storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes. Exemplary computer readable signals, whether modulated using a carrier or not, are signals that a computer system can be configured to access, including signals downloaded through the Internet or other networks. Concrete examples of the foregoing include distribution of executable software program(s) of the computer program on a CD-ROM or via Internet download. In a sense, the Internet itself, as an abstract entity, is a computer readable medium. The same is true of computer networks in general.

It should be noted that the term token denotes a small, portable device which typically has an embedded integrated circuit with a microprocessor, a memory and an internal operating system, which stores electronic data and programs, and which is typically utilized for security and/or establishing an identity. Examples of tokens include devices which are some-times referred to as smartcards, contactless cards, cryptographic tokens, authentication tokens, USB (universal serial bus) tokens, USB keys, USB buttons, and the like, and variants or evolutions thereof. Tokens may transfer data in combination with a wireless protocol, a serial or parallel data transfer protocol such as USB, or variations and evolutions of data transfer protocols. Tokens can operate in connection with standards such as ISO/IEC (International Organization for Standardization/International Electrotechnical Commission) 7816, ISO/IEC 7810, ISO 14443 RFID (radio frequency identification), ISO 15693 RFID, EMV (Europay Mastercard Visa) version 4.00, PC/SC (personal computer/smart card), and/or other standards; custom protocols and definitions; and variants and evolutions thereof.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
   an interface operable to communicate with a token device and to provide data objects to the token device in compressed form; and
   a processor device coupled to the interface, to:
      determine a first data object and a second data object that are associated with the token device, wherein the first data object comprises at least one of a certificate, a public key, a cryptographic token interface, or an identifier, and wherein the second data object comprises at least one of a certificate, a public key, a cryptographic token interface, or an identifier;
      aggregate the first data object and the second data object into a group of data objects;
      compress the group of data objects into a unit of contiguous data to be written to the token device as a set of blocks;
      establish a connection to the token device;
      verify the token device;
      write the set of blocks to the token device via the interface when the token device has been verified; and
      disconnect from the token device.

2. The system of claim 1, wherein the writing is performed via a secure connection over the interface.

3. The system of claim 1, wherein the writing of the set of blocks to the token device is performed during one or more of: enrollment of the token device, recovery of data for the token device, or loading of executable instructions on to the token device.

4. The system of claim 1, wherein the processor device is further to associate a version number with the unit of contiguous data to be written to the token device, write the version number to the token device in association with the unit of contiguous data, update the unit of contiguous data when at least one of the group of data objects is changed, and change the version number when the unit of contiguous data for the token device is updated.

5. The system of claim 1, wherein the processor device is further to retrieve the first data object and the second data object from non-contiguous memory before the aggregating.

6. The system of claim 1, wherein the aggregating is in accordance with a data format.

7. A method comprising:
   determining a first data object and a second data object, wherein the first data object comprises at least one of a certificate, a public key, a cryptographic token interface, or an identifier, and wherein the second data object comprises at least one of a certificate, a public key, a cryptographic token interface, or an identifier;
   aggregating, by a processor device, the first data object and the second data object into a group of data objects;
   compressing the group of data objects into a unit of contiguous data to be written to the token device as a set of blocks;
   establishing a connection to the token device;
   verifying the token device;
   writing the set of blocks to the token device when the token device has been verified; and
   disconnecting from the token device.

8. The method of claim 7, wherein the connection is a secure connection.

9. The method of claim 7, wherein the writing of the set of blocks to the token device is performed during one or more of: enrollment of the token device, recovery of data for the token device, or loading of executable instructions on to the token device.

10. The method of claim 7, further comprising associating a version number with the unit of contiguous data to be written to the token device, and writing the version number to the token device in association with the unit of contiguous data, wherein the version number is changed when the unit of contiguous data for the token device is changed.

11. The method of claim 7, further comprising retrieving the first data object and the second data object from non-contiguous locations in memory before the aggregating.

12. The method of claim 7, wherein the aggregating is in accordance with a data format.

13. A non-transitory machine-accessible medium including instructions that, when executed by a processor device, cause the processor device to perform operations comprising:
   determining, by the processor device, a first data object and a second data object, wherein the first data object comprises at least one of a certificate, a public key, a cryptographic token interface, or an identifier, and wherein the second data object comprises at least one of a certificate, a public key, a cryptographic token interface, or an identifier;
   aggregating, by the processor device, the first data object and the second data object into a group of data objects;
   compressing, by the processor device, the group of data objects into a unit of contiguous data to be written to the token device as a set of blocks;
   establishing a connection to the token device;
   verifying the token device;
   writing, by the processor device, the set of blocks to the token device when the token device has been verified; and
   disconnecting from the token device.

14. The non-transitory machine-accessible medium of claim 13, wherein the connection is a secure connection.

15. The non-transitory machine-accessible medium of claim 13, wherein the writing of the set of blocks to the token device is performed during one or more of: enrollment of the token device, recovery of data for the token device, or loading of executable instructions on to the token device.

16. The non-transitory machine-accessible medium of claim 13, wherein the operations further comprise:
   associating a version number with the unit of contiguous data to be written to the token device, and writing the version number to the token device in association with the unit of contiguous data, wherein the version number is changed when the unit of contiguous data for the token device is changed.

17. The non-transitory machine-accessible medium of claim 13, wherein the operations further comprise:
retrieving the first data object and the second data object from non-contiguous locations in memory before the aggregating.

18. The non-transitory machine-accessible medium of claim 13, wherein the aggregating is in accordance with a data format.

\* \* \* \* \*